United States Patent
DeLeon et al.

(10) Patent No.: US 6,702,934 B1
(45) Date of Patent: Mar. 9, 2004

(54) PULSED ARC MOLECULAR BEAM DEPOSITION APPARATUS AND METHODOLOGY

(75) Inventors: Robert L. DeLeon, Williamsville, NY (US); James F. Garvey, Williamsville, NY (US); Eric F. Rexer, Westmont, IL (US); Gary S. Tompa, Belle Mead, NJ (US)

(73) Assignee: AMBP Tech. Corp., Amherst, NY (US)

( * ) Notice: Subject to any disclaimer, the term of this patent is extended or adjusted under 35 U.S.C. 154(b) by 67 days.

(21) Appl. No.: 09/853,006

(22) Filed: May 10, 2001

Related U.S. Application Data

(60) Provisional application No. 60/277,993, filed on Mar. 22, 2001.

(51) Int. Cl.[7] .............................................. C23C 14/24
(52) U.S. Cl. ............................. 204/298.41; 204/192.38
(58) Field of Search ...................... 204/192.38, 298.41

(56) References Cited

U.S. PATENT DOCUMENTS

| | | | |
|---|---|---|---|
| 4,906,811 A | * | 3/1990 | Buil ...................... 204/192.38 |
| 5,096,558 A | * | 3/1992 | Ehrich ................... 204/192.38 |
| 5,387,326 A | * | 2/1995 | Buhl et al. ............. 204/192.38 |
| 5,482,734 A | * | 1/1996 | Herwig et al. ................. 427/8 |

* cited by examiner

Primary Examiner—Rodney G. McDonald
(74) Attorney, Agent, or Firm—William L. Botjer

(57) ABSTRACT

Deposition of thin films or powders by reactive pulsed arc molecular beam deposition. To produce these films and powders, a reactive or non-reactive gas is pulsed between a pair of electrodes situated within a vacuum chamber. The gas can be either chemically inert, to produce pure cathode material films, or chemically reactive, to produce chemical compounds of the cathode material. A storage capacitor is discharged between the electrode pair during the gas pulse. The gas serves as a carrier to direct and transport the ablated material to a substrate which is placed inline with the gas pulse, on which a film or powder of the electrode material or a chemical compound of the electrode material is then coated.

20 Claims, 4 Drawing Sheets

PULSED ARC MOLECULAR BEAM DEPOSITION APPARATUS AND METHODOLOGY

CROSS REFERENCE TO RELATED APPLICATIONS

This application claims the benefit of the filing date of U.S. provisional patent application Serial No. 60/277,993 filed Mar. 22, 2001.

STATEMENT OF GOVERNMENT SUPPORT OF INVENTION

The invention herein was supported by BMDC Phase 1 SBIR Contract No. DAAG55-97-C-0038.

BACKGROUND AND SUMMARY OF THE INVENTION

There is a large demand for thin films for use in optical and optical-electronic devices, as insulating and diffusion barriers in silicon-on-insulator electronic devices, chemical sensors, MEMs, pyroelectrics and superconducting films among others. New materials and new approaches to material deposition are constantly being developed to meet just such specific needs in industry and research, For every new materials need, typically, there is one method which is optimal with respect to quality and cost. Therefore, it is beneficial to investigate new types of deposition systems.

The present pulsed arc molecular beam deposition (PAMBD) apparatus was developed to deposit high quality thin films of materials upon substrates within a vacuum chamber. The system is based upon a cluster ion source developed by Siekmann et al. (Z. Phys. D: At., Mol. Clusters 20, 417 (1991) a pulsed arc cluster ion source which has been used primarily as an ion source for the mass spectrometric study of metal cluster ions. The PAMBD source was developed as an inexpensive alternative to reactive pulsed laser deposition (PLD) to produce a variety of metal containing films, such as metal oxide films, that will be the primary topic of the present discussion.

To produce these films and powders, a reactive or non-reactive gas is pulsed between a pair of electrodes situated within a vacuum chamber. A storage capacitor is discharged between the electrode pair during the gas pulse. A substrate is placed inline with the gas pulse, on which an film or powder of the electrode material is then coated. The cathode electrode surface is ablated creating a plasma plume of the cathode material. Gas is pulsed across the rod synchronously with the discharge pulse. The gas serves as a carrier to direct and transport the ablated material to the substrate. As will be discussed in detail, metal, metal nitride, metal oxide, metal carbide, metal halide, carbon, silicon and metal/carbon/ silicon composite films can be generated by PAMBD. The gas can be either chemically inert, to produce pure cathode material films, or chemically reactive, to produce chemical compounds of the cathode material. A specific difference of the present processes to PLD is that the gas flow is designed to always sweep clean the source region, whereas in PLD, any process gases are diffused throughout the reactor and are a source of beam diffusion and memory effects.

BRIEF DESCRIPTION OF THE DRAWINGS

For a better understanding of the invention, reference is made to the following drawings which are to be taken in conjunction with the detailed description to follow in which.

DESCRIPTION OF THE PREFERRED EMBODIMENTS

Figure 1:
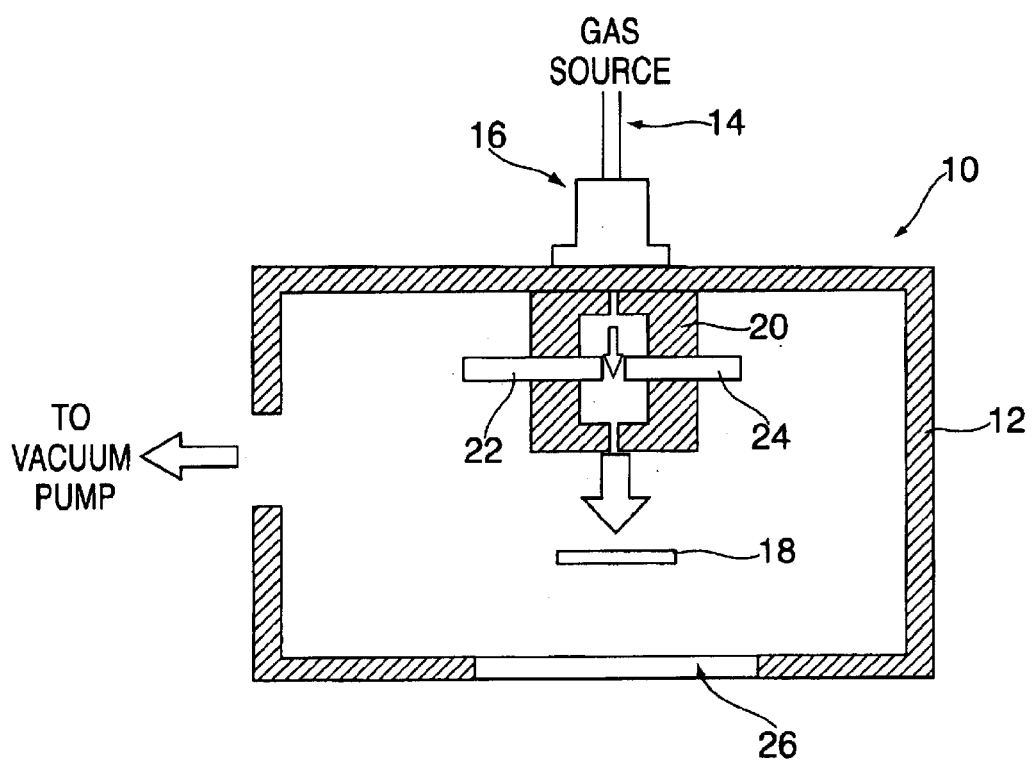
FIG. 1 illustrates schematically the apparatus for carrying out pulsed arc molecular beam deposition PAMBD in accordance with the present invention.

FIG. 1 illustrates schematically the apparatus 10 for carrying out pulsed arc molecular beam deposition of a thin film or powder which includes a vacuum chamber 12 which is evacuated by a vacuum pump (not shown). A gas source 14 will deliver a pulse of gas into chamber 12 when a pulsed valve 16 is activated. Also disposed within chamber 12 is the substrate 18 on which the material is to be deposited. Mounted in a housing 20 are an anode 22 and a cathode 24 which are comprised of the material to be deposited. A window 26 permits viewing of the deposition process.

If, for example, a metal oxide thin film is to be deposited, the thin film starting materials are a reactive gas, such as $O_2$, and a pair of conducting electrodes composed of the pure metal of interest. A high voltage electrical discharge, 1000 V, is struck between the pair of electrodes (anode 22 and cathode 24) inside vacuum chamber 12. The discharge energy is estimated at 1.5 J/pulse. The distance between electrodes 22, 24 was kept between 1 and 3 mm for all experiments. Prior to triggering the electrical discharge, a gas is pulsed by pulse valve 16 between the ends of cylindrical electrodes 22, 24. The gas pulse lasts two orders of magnitude longer than the arc, so a relatively high pressure is established inside the PAMBD source prior to the discharge and continues during and after the discharge arc plasma.

Relative to the high vacuum, $10^{-6}$ mbar, environment of vacuum chamber 12, the gas pulse creates a sufficient pressure between electrodes 22, 24 to support a cold cathode electric discharge. Cold cathode field emission is spontaneous emission of electrons from inside a cold cathode to the space outside of the cathode. In the case being discussed, the discharge occurs between an electrode pair in the source. The emission has been shown to start at "whisker-like" surface imperfections with an approximate 0.5 micron radius on the cathode surface. The electric field can be two orders of magnitude larger than the average field of the cathode on these imperfections. With these enhanced local fields, some electrons will spontaneously tunnel into the vacuum.

Dielectric imperfections embedded in a cathode or dielectric coating on part of a cathode can also support high local electric fields. A common way to initiate arcing is to form a triple junction on the cathode. Adding dielectric material or coating part of the cathode with a dielectric material allows high electric fields at the metal-dielectric-vacuum junction.

Using a reactive gas, such as oxygen, that creates a dielectric film on at least part of the electrodes of the PAMBD system is beneficial to its operation.

When a critical current density (about $10^{12}$ A/m$^2$) is achieved at a whisker-like emitter or triple junction, joule heating causes the cathode material to melt, sublimate, and evaporate. With a high local pressure of sublimated material and free electrons ionizing the background gas, a cascade of primary emission electrons, secondary electrons, and sublimated electrode material are accelerated across the electrode potential gap to the anode.

In the PAMBD process, this plasma also serves as the high energy environment which produces a chemical reaction between the ablated material and the gas. At favorable gap widths and source pressures, secondary ionization can form a bridge across the electrode gap to form a conducting bridge, represented by the Paschen curve. Around the minimum of the curve are values of pressure and electrode gap which give the most abundant secondary electron emission from the source gas and favor plasma arc formation. When a conducting bridge is established across the gap, a capacitor can discharge across the gap.

In the PAMBD process, the gas pulse also moves the sputtered material from the discharge area and onto a substrate to create a thin film. Selecting a reactive gas to pulse through the ablated cathode material gives a chemically altered thin film of the starting cathode electrode material. The reactive gas also causes oxidation of the cathode which produces more surface imperfections (more triple junctions).

A major advantage of the PAMBD is the low cost of the system relative to a pulsed laser deposition (PLD) system or a laser assisted molecular beam deposition (LAMBD) system. The entire PAMBD system can be built for a fraction of the current price of just the laser needed to operate a PLD system. Although the PAMBD system makes sense economically, it is limited in its materials capabilities compared to a laser ablation based system. Unlike PLD, which can use virtually any target rod, the PAMBD system is limited to electrically conducting materials.

Vacuum arc phenomena have been studied extensively for a century, but the process is not very well understood. The reason there is a lack of understanding of the basic process is that vacuum arcs are extremely sensitive to experimental conditions. A few important conditions are, but not limited to gas pressure, electrode temperature, cathode surface morphology, and electrode shape. As soon as an arc is initiated across a spark gap, the listed conditions change and continue to change during the arc's lifetime, therefore the arc's behavior changes constantly.

Once a discharge is established, the current flows through multiple hot spots on the cathode that are called cathode spots. In a cathode spot, current densities can vary widely depending on the conditions: a value of $10^8$ A/m$^2$ was given as a maximum value in one reference and $10^2$ A/m$^2$ in another reference.

After the discharge, cathode spots leave craters due to ablation that can vary in size. In scanning electron microscopy (SEM) studies of ablated cathode surfaces, craters greater than 10 $\mu$m in diameter are visible next to craters less than 1 $\mu$m. Crater size is dependent on the current and cathode surface properties. A clean unoxidized surface after ablation will have craters one to two times larger in diameter than a surface with a thick oxide coating. Along with smaller crater size, less molten droplet formation has been observed from the oxidized surfaces especially when ablated in the presence of a reactive background gas. For these reasons it is beneficial to operate the PAMBD system with a reactive gas to generate better quality films.

Cathode spot formation begins with a surface explosion probably at a surface imperfection or triple junction as mentioned earlier. Ions, electrons, and neutrals are ejected from the surface in a 1 ns time frame. The pressure of the local plasma is very high and it deforms the area directly adjacent to where the material was ejected. This area had undergone joule heating during the process of ejecting electrons, so it is probably in the liquid state. A crater is formed within 5 ns of the explosion by the plasma pressure on the liquid. Molten droplets are formed within 40 ns of the beginning of cathode spot formation, within 40 ns the pressure causes the liquid to splash out of the plasma pressure formed crater. 40 ns is about the total lifetime of a cathode spot. The time for discharging the storage capacitor across the electrode gap in the PAMBD system was observed to be about 10 $\mu$s, so the discharge behavior reported for continuous dc discharge should be applicable to the PAMBD system.

The most probable angle of ejection of droplets from a 1 kA discharge from a copper electrode was observed to be about 20° for particles up to 80 $\mu$m in diameter with velocities in the maximum range of 700–800 m/s and much smaller velocities for larger droplets. Droplet ejection is thought to be the major cause of cathode erosion in low boiling point metals, but it is small in refractory metals such at Ti. The ejected droplets are heated in the plasma by free electron and ion bombardment, so they can sublimate, evaporate, or remain as droplets depending on the conditions. The droplets are thought to be the main source of neutrals in the interelectrode plasma. Typically, net cathode erosion rates depend strongly on current density, cathode surface condition, and cathode material. Some examples of observed rates are from 35 to 115 $\mu$g/C from copper cathodes to 30 to 52 $\mu$g/C for titanium electrodes.

The discharge in the PAMBD source can be categorized as an intense arc. Visible anode spots, which can be observed on the anode during an intense arc, have been observed on the PAMBD anode. The spots are caused by large local current densities on the anode. The local current can cause ionization and evaporation of anode material and sputtering of droplets just as in the cathode spots. The ions ejected from the anode are thought to be ionized on the anode surface by energetic electrons from the cathode. Evaporated neutrals and droplets are caused by intense local heating on the anode. The anode of the PAMBD system usually does not show a net mass loss. This is due to cathode material depositing directly upon the anode, which usually results in a net mass gain of the anode.

Figure 2:
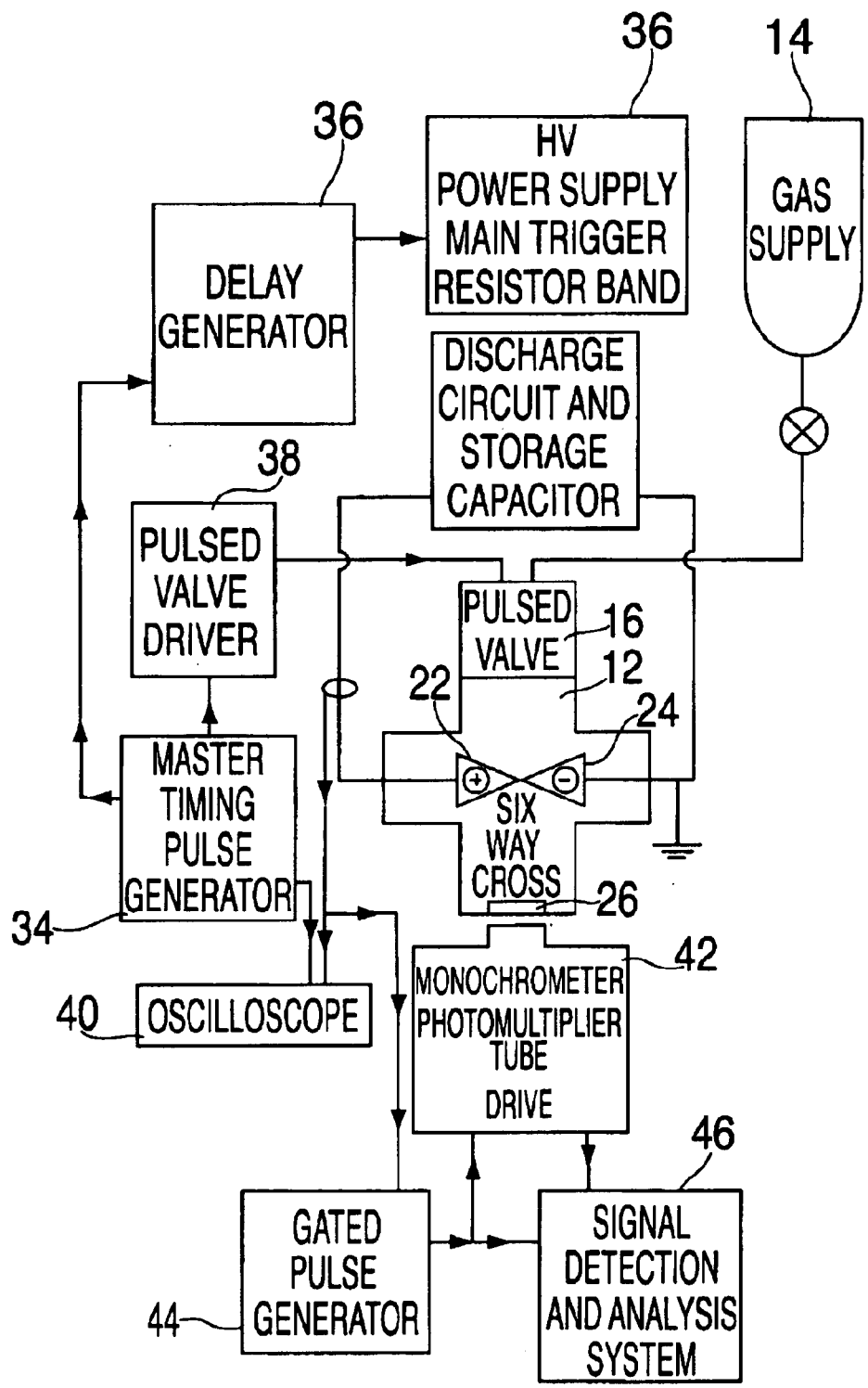
FIG. 2 is a block diagram of the control system of the deposition apparatus of the present invention.

Excluding the peripheral equipment, the PAMBD system can be broken down into two subsystems: The mechanical apparatus and the electrical system which are illustrated as a block diagram in FIG. 2. The mechanical apparatus provides a clean vacuum environment for material deposition, shielding and containment of the electrical discharge, and mechanical positioning of the discharge electrodes. The electrical system consists of dc power supplies 30, an energy storage capacitor and discharge circuit 32, and other triggering, timing, and safety components needed for operation.

The mechanical apparatus subsystem was designed as units bolted onto a high vacuum six-way cross which form vacuum chamber 12. Switching the position of the functional unit's placement on the cross offers multiple optional configurations.

An oil diffusion pump is bolted to the bottom flange of the six-way cross. The low vacuum port, pressure gauges, and bleed valve are on the top of the six-way cross. Anode 22 and cathode 24 are located on opposite sides of the six-way cross. Each electrode unit consists of a high vacuum linear positioner and a high voltage feed through. The ceramic PAMBD source block is suspended on a vacuum flange into the middle of the six-way cross between the two electrodes. The electrodes enter the ceramic block from opposite sides and protrude into a cavity inside the block where the actual discharge takes place. The source flange also contains a pulsed valve connected to a gas source and a linear positioner for the ceramic block. On the final flange is a 4 in. diameter window 26. The window allows for optical plasma monitoring and visual trouble shooting of the process. The substrate to be coated is suspended in this leg of the cross by a spring mechanism that fits to the inside of the cross.

The electrical subsystem consists of six major units plus peripheral components. A high voltage dc power supply 30 converts 110 V alternating current into 1200 V direct current. A resistor bank is used to limit the charging current of the circuit. The resistor bank has 12 kΩ resistance to give an RC time constant of 0.25 s, which allows for about 2 Hz operation. A storage capacitor 32 stores 20 $\mu$F of charge until it is released through the silicon controlled rectifier (SCR). The main trigger board 34 is a monostable timer circuit that produces the proper trigger pulse to capacitor discharge circuit 32 when two conditions are met. These conditions are that a trigger signal is received through a delay generator 36 from master timing pulse generator 34 and that discharge capacitor 32 is fully charged. A capacitor discharge circuit channels the charge from the storage capacitor to the electrodes inside the vacuum chamber when it is triggered. This is achieved by sending the trigger signal from the main trigger board through a high voltage transistor optocoupler/isolator that electrically isolates the main trigger board from the capacitor discharge circuit that floats at a 1000 V potential when fully charged. This signal is used as the gate signal to trigger the SCR, which is connected in series between the cathode of the discharge capacitor and the anode of the vacuum spark gap. A discharge resistor/inductor limits the peak current from the capacitor discharge, temporally stretches the pulse width, and helps smooth any current spikes. The resistor/inductor is an approximately 30 cm long length of nickel-chromium wire wound into a 25 mm diameter coil of ten wraps. The resistance is one ohm and the inductance less than 1 $\mu$H. The nominal RC constant of the discharge capacitor and the resistor/inductor is 20 $\mu$s. The actual discharge time, as measured by an oscilloscope, was found to be slightly shorter in duration, about 10 $\mu$s. The anode and cathode units were also included in the description of the mechanical system, since they contain elements of both systems. These units bring the charge safely into the discharge region of the source.

The master timing pulse generator 24 synchronizes the data collection, pulsed valve trigger, and arc triggering. Pulse generator 34 is used as a master timing pulse generator to supply 1–2 Hz 15 V pulses directly to the pulsed valve driver 38 and 5 V pulses to the delay generator 36. The pulsed valve driver 38 conditions the 15 V signal to give a 170 V signal to the pulsed valve solenoid 16, (General Valve Series 9). The signal from delay generator 36 is sent to the main trigger board circuit of the PAMBD electronics that then triggers the SCR that discharges the storage capacitor. The discharge is monitored at the electrode leads across a sampling resistor. The deposition process can be monitored by an oscilloscope 40, a monochrometer/photomultipier 42 (looking through window 26, a gated pulse generator 44 and a signal detector 46.

Vacuum chamber 12 is evacuated by an oil diffusion pump with a liquid nitrogen trap. The ultimate background pressure of vacuum chamber 12 is $1 \times 10^{-6}$ mbar. The pressure in the chamber is typically set at a peak pressure of $1 \times 10^{-4}$ mbar during the film deposition. The pressure is set by controlling the amount of gas pulsed into the vacuum chamber. The flux on the oxygen beam can be estimated at $8 \times 10^{17}$ molecules per pulse. A nude ion gauge monitors the vacuum chamber pressure. The average pressure inside the PAMBD source during typical operating conditions was estimated to be on the order of $1 \times 10^{-4}$ mbar. The peak maximum and minimum pressures inside the source during 2 Hz operation probably differ by three or four orders of magnitude.

It is to be born in mind that the gas and arc pulse duration are variable over wide ranges. By way of example, the arc pulse duration can range from $10^{-9}$ to $10^{-2}$ and the gas pulse duration can range from $10^{-4}$ to $10^{-2}$. The only limits on the deposition pulse rate is the vacuum pump and the design of the electronic discharge system. There is no inherent limit on the deposition rate.

EXAMPLES

Results from production of titanium, cerium, and tin oxide films are presented in the following sections. Carbon, copper, copper oxide, and lead oxide films were also deposited with the PAMBD system.

A. Titanium Oxide Film Production

Two pure titanium tubes (Goodfellow, 6.35 mm outside diameter, 0.89 mm wall, 99.6%) were used for electrodes. The cathode was ablated by 2 Hz 1400 A pulses with an approximate 10 $\mu$s dc arc discharge. The electrodes are ablated at a net rate of about 0.7 mg/h (0.7 mg/7200 pulses). In a typical experiment, the cathode loses about four times as much mass as the anode gains. The mass of the anode is increased due to material being sputtered directly from the cathode to the anode. Pure oxygen (reservoir pressure 15 psig, Irish Welding Supply) is pulsed between the electrodes. The gas pulse is synchronized with the dc discharge. A 1 ms delay between the start of the 2 ms $O_2$ pulse and start of the arc discharge was used. A glass microscope slide is positioned several centimeters from the source nozzle. This slide is held at room temperature and is used as a film substrate.

The emission spectrum of the $Ti/O_2$ plasma in the PAMBD source was collected and analyzed. The emission spectrum is nearly identical to the emission spectrum observed using a (LAMBD) system to deposit titanium oxide films. A simulated spectrum was previously generated and matched to the LAMBD experimental spectrum using a model incorporating over 500 catalogued Ti and $Ti^+$ emission lines and temperature and fractional ionization parameters. Values for the LAMBD plasma temperature and fractional ionization were estimated to be about 15000 K and 0.5 fractional ionization. Since the PAMBD Ti spectrum closely matches the LAMBD Ti emission spectrum, nearly the same conditions are expected to exist in both systems.

Figure 3:
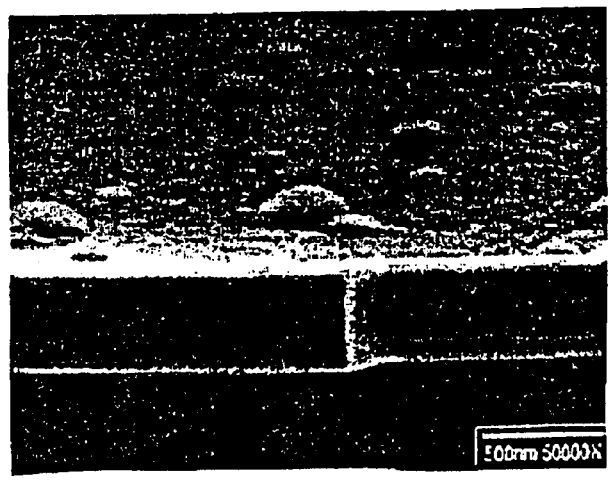
FIG. 3 is an scanning electron microscope (SEM) image of a titanium oxide film deposited using the PAMBD system.

FIG. 3 is an SEM image of a titanium oxide film deposited using the PAMBD deposition system. When taken out of the deposition chamber, the titanium oxide thin film appeared light gray and slightly yellow with two interference fringes visible indicating a thickness of about ½ $\mu$m. This film was deposited with about 30000 discharge pulses to a final thickness of 400 nm and total area of about 5 cm². The glass substrate was positioned about 3.5 cm from the source nozzle. Several droplet imperfections appear on the approximately 1 μm surface shown in the image, and all have apparent diameters of less than 100 nm.

Figure 4:
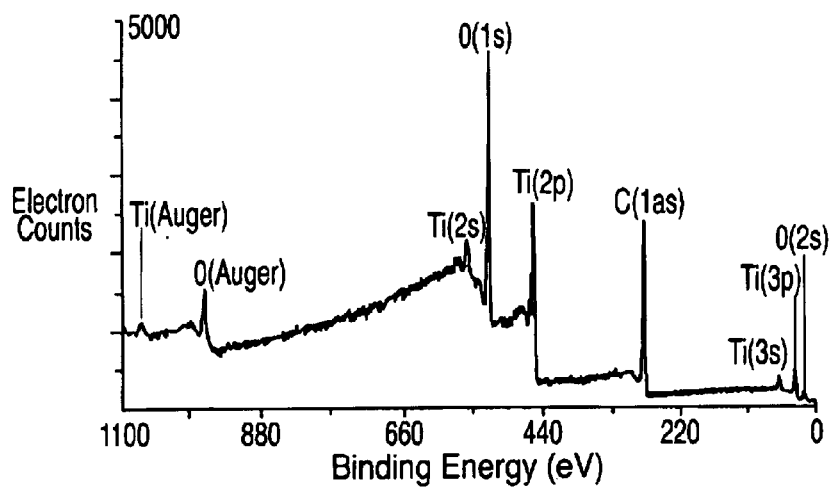
FIG. 4 is the spectrum of an electron spectroscopy for chemical analysis (ESCA) analysis of a titanium oxide film deposited using the PAMBD system.

The titanium oxide films were characterized by electron spectroscopy for chemical analysis (ESCA). Only titanium, oxygen, and carbon appear in the low resolution survey scan of the PAMBD titanium oxide film, shown in FIG. 4. The carbon impurity is present to some extent in almost all ESCA spectra unless special precautions are taken to exclude it. The carbon comes from oil vapor in the vacuum chamber and from the air during film storage and transportation to the ESCA instrument. The 285 eV C (1s) peak is usually used as an internal reference in the ESCA spectrum.

From the high resolution ESCA spectra of individual peaks, the charge corrected binding energy of the O (1s) photoelectron peak, near 530 eV corresponds to the $O^{2-}$ anion in metal oxides and a smaller 532 eV peak corresponds to surface hydroxyl groups. The binding energies and spin orbit splitting of the Ti ($2p_{1/2}$) and Ti ($2p_{3/2}$), located at charge corrected binding energies 464.86 and 459.10 respectively, agree with reported values for $TiO_2$ There is no evidence in the high resolution ESCA spectrum of the Ti (2p) binding energy peaks of unreacted Ti in the films.

An ESCA elemental profile through the depth of the film shown in the SEM image in FIG. 3 was collected. The O to Ti atom percent appears to be a consistent two to one throughout the depth of the film, in agreement with $TiO_2$ stoichiometry.

B. Cerium Oxide Film Production

Two pure cerium rods (Goodfellow, 6.35 mm diameter, 99.9% pure) were ablated in the same manner as the titanium tubes. The electrodes are ablated at a net rate of about 4 mg/h (4 mg/7200 pulses). Pure oxygen (15 psig, Irish Welding Supply) is pulsed between the electrodes. A glass microscope slide or a piece of a Si(111) wafer positioned several centimeters from the source nozzle and held at room temperature is used as a film substrate.

Figure 5:
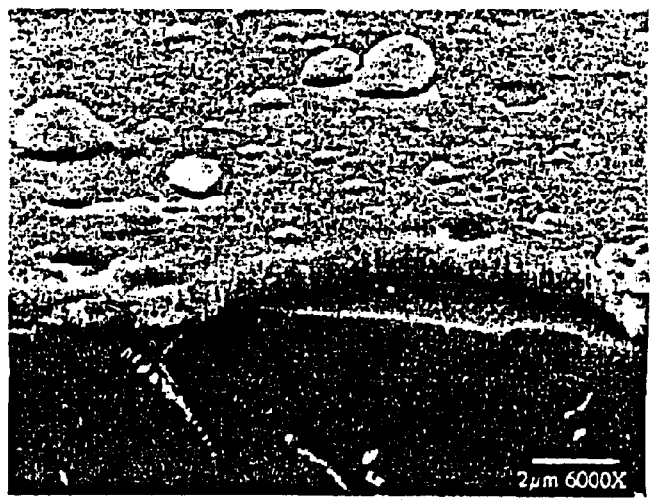
FIG. 5 is an scanning electron microscope (SEM) image of a cerium oxide film deposited using the PAMBD system.

When taken out of the deposition chamber, the cerium oxide thin films appear to have a bright mirror like sheen with brightly colored interference fringes visible. FIG. 5 is a SEM image of a cerium oxide film deposited on a glass substrate. The film had two interference fringes which indicates a thickness of about ½ μm. The thickness of the film observed in the SEM image agrees with the estimate. The film in FIG. 5 appears to be smooth with droplets up to 2 μm in diameter and some debris on the surface. The debris may be due to the oxide layer on the cerium electrodes being shattered and ejected during the arcing process. Cerium is a very reactive metal: The cerium rod used for the experiments would oxidize to a green color ($Ce_2O_3$) immediately after scraping a clean metal surface on the rod. After an experiment the electrodes would have a thick oxide layer visible on them that could be easily dislodged mechanically.

Figure 6:
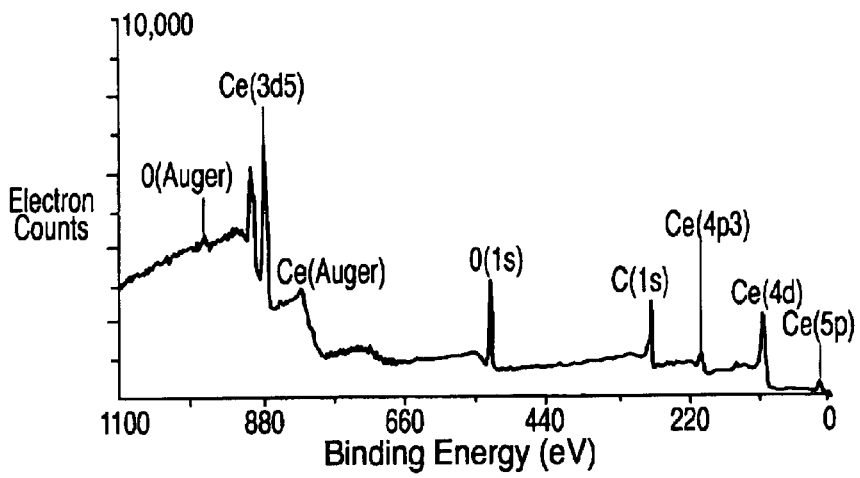
FIG. 6 is the spectrum of an electron spectroscopy for chemical analysis (ESCA) analysis of a cerium oxide film deposited using the PAMBD system.

Cerium oxide films characterized by ESCA showed no contaminants except for carbon. A low resolution spectrum is shown in FIG. 6.

C. Tin Oxide Film Production

Two pure tin rods (Goodfellow, 6.35 mm diameter, 99.99% pure) were ablated in the same manner as the Ti tube. The electrodes are ablated at a net rate of about 2.3 mg/h (2.3 mg/7200 pulses). Pure oxygen (Irish Welding Supply) is pulsed between the electrodes. A glass microscope slide positioned several centimeters from the source nozzle and held at room temperature is used as a film substrate.

Figure 7:
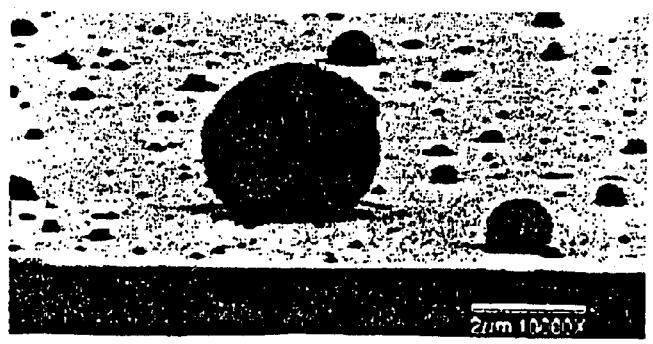
FIG. 7 is an scanning electron microscope (SEM) image of a tin oxide film deposited using the PAMBD system.

When taken out of the deposition chamber, the tin oxide thin films appear hazy gray brown and have colored interference fringes. FIG. 7 is a SEM image of a tin oxide film deposited on a glass substrate. The film had one interference fringe which indicates a thickness of about ¼ μm. The film thickness observed in the SEM image agrees with the estimate. In the SEM image, the film appears to be smooth with a high density of droplets ranging in size from hundreds of nanometers up to 2 μm. The droplets are due to the arc melting the tin electrodes and liquid tin droplets being ejected from the electrodes during the deposition process. Tin is the lowest melting temperature (232° C.) material attempted to be deposited in the PAMBD source and it has the most droplet deposition of any system studied so far.

Figure 8:
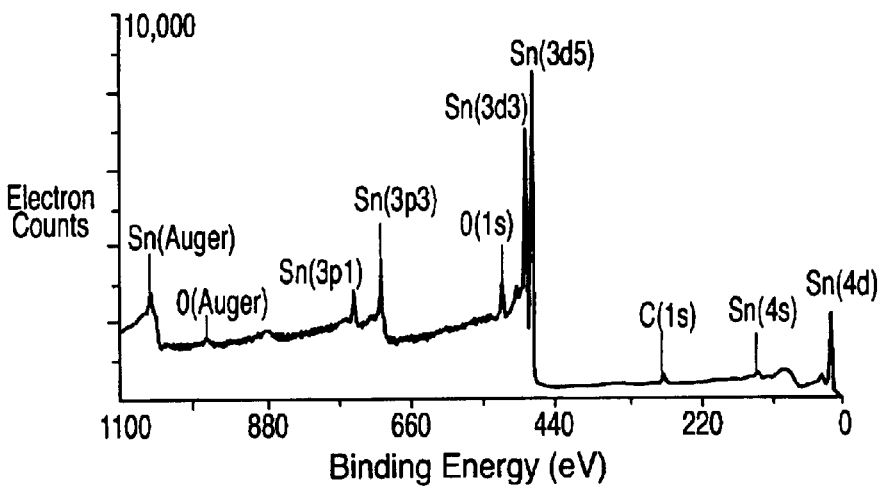
FIG. 8 is the spectrum of an electron spectroscopy for chemical analysis (ESCA) analysis of a tin oxide film deposited using the PAMBD system.

The low resolution ESCA spectrum of a tin oxide film, FIG. 8, shows no contaminants except carbon. The oxidation states of the tin could not be determined by ESCA because the Sn (3d) electron binding energies of the $SnO_2$ and SnO species are too close to differentiate in the spectra taken, but the films are probably a mixture of both oxidation states.

Titanium, cerium, and tin oxide thin films were deposited using the PAMBD technique. The films were analyzed by SEM and ESCA for their physical and chemical proper-ties. The titanium films were found to be relatively smooth and with few surface imperfections. The cerium films had slightly more droplet formation, some had debris. The debris is possibly from fracturing the film and substrate for SEM analysis, or from the thick oxide layer which readily forms on the highly reactive Ce metal rod being ejected during the arcing process. The tin system, a relatively low melting temperature material, showed extensive droplet deposition on the substrate surface probably due to heating and melting of the electrodes in the arc and ejection of liquid droplets during the deposition experiment. Film quality appears to be affected by the starting material melting temperature: Ti 1660° C., Ce 798° C., and Sn 232° C., with the higher melting temperature metals giving better surface morphologies. There are no chemical impurities seen in the low resolution ESCA spectra except for the expected adventitious carbon.

The gas used in the PAMBD process can be either chemically inert (such as helium, neon, argon or other Nobel gases), to produce pure cathode material films, or chemically reactive (oxygen, nitrogen, as well as gases that form carbide, halide, sulfide and fluoride compounds to produce chemical compounds of the cathode material Therefore, in addition to the metal oxide films described above, the PAMBD process can also be used to produce metal, metal nitride, metal oxide, metal carbide, metal halide, amorphous carbon and carbon allotropes (including fullerenes such as C60 and C70), carbon-containing, silicon-containing and metal/carbon, metal/silicon, silicon/carbon composite films. Non limiting examples of such compounds include halides formed from halogen gas (ie, $F_2$, $Cl_2$, $Br_2$, $I_2$); sulfides formed from $H_2S$ or $SO_2$ gases; carbides formed from $CO_2$, CO, alkanes or alkenes and nitrides formed from N2 or NH3, or any of these reactive gases diluted in any of the previous unreactive gases. In general, the PAMBD process can be used to deposit films of any composition containing either a metallic element, carbon or silicon. Nanopowders may also be produced by this process.

With only slight alterations, such as by replacing the flat substrate with a collection basket to collect particles or by using an extended nozzle and a particle collection apparatus such as a cold finger in place of the substrate the PAMBP apparatus can be used to produce nanopowders or ultrafine powders. Nanopowders are composed of nanoparticles of sizes ranging between 3 and 100 nm. Nanopowder applications include high surface area supports for catalysts, heat sinks, tribological and thermal barrier coatings, optoelectronics and photovoltaics, capacitors, batteries, polishing compounds and magnetic recording heads. High purity nanopowders of carbides and nitrides in particular are not presently commercially available. The simple, inexpensive, PAMBP technique will be useful for many materials. Nanopowders of metal, metal nitride, metal oxide, metal carbide, metal halide, carbon, metallo-carbohederenes and other metal/carbon composites are good candidates for synthesis by PAMBP.

The invention has been described with respect to preferred embodiments. However, as those skilled in the art will recognize, modifications and variations in the specific details which have been described and illustrated may be resorted to without departing from the spirit and scope of the invention as defined in the appended claims.

What is claimed is:

1. Apparatus for depositing a thin film of material, comprising:
   a) a vacuum chamber;
   b) means for holding a substrate disposed within said vacuum chamber;
   c) vacuum pump means for evacuating said vacuum chamber;
   d) means for injecting a pulse of gas into said chamber;
   e) electrode means disposed between said gas injecting means and said substrate holder, said electrode means having a cathode and an anode constructed from the material to be deposited;
   f) means for causing an arc to be discharged between said cathode and anode; and
   g) means for controlling the gas pulse injecting means and said arc discharging means such that a gas pulse is first triggered with an arc being triggered after the gas pulse commences, wherein material ablated from the electrodes will be carried by the pulse of gas towards the substrate and be deposited thereon.

2. The deposition apparatus as claimed in claim 1, wherein the duration of the gas pulse is on the order of at least 10 times that of the arc discharge.

3. The deposition apparatus as claimed in claim 1, wherein the gas injected into the chamber is reactive with the material to be deposited.

4. The deposition apparatus as claimed in claim 3, wherein the reactive gas is selected from the group consisting of oxygen, nitrogen and gases that form carbide, halide, sulfide and fluoride compounds.

5. The deposition apparatus as claimed in claim 1, wherein the material to be deposited comprises a metal.

6. The deposition apparatus as claimed in claim 3, wherein the material to be deposited is selected from the group consisting of carbon, silicon, and conductive metals.

7. The deposition apparatus as claimed in claim 1, wherein the gas injected into the chamber is chemically inert with the material to be deposited.

8. The deposition apparatus as claimed in claim 7, wherein the inert gas comprises a noble gas.

9. The deposition apparatus as claimed in claim 1, further including deposition monitoring apparatus selected from the group consisting of: an oscilloscope, a monochrometer, a gated pulse generator and a signal detector.

10. The deposition apparatus as claimed in claim 1, wherein said arc ends before said gas pulse terminates.

11. Apparatus for depositing a thin film of material in a vacuum chamber, comprising:
    a) means for holding a substrate disposed within said vacuum chamber;
    b) means for injecting a pulse of gas into said chamber;
    c) electrode means disposed between said gas injecting means and said substrate holder, said electrode means having a cathode and an anode, at least one of said cathode and said anode being constructed from the material to be deposited;
    d) means for causing an arc to be discharged between said cathode and anode; and
    e) means for controlling the gas pulse injecting means and said arc discharging means such that a gas pulse is first triggered with an arc being triggered after the gas pulse commences and said arc ending before said gas pulse terminates, wherein material ablated from the electrodes will be carried by the pulse of gas towards the substrate and being deposited thereon.

12. The deposition apparatus as claimed in claim 11, wherein the duration of the gas pulse is on the order of at least 10 times that of the arc discharge.

13. The deposition apparatus as claimed in claim 11, wherein the gas injected into the chamber is reactive with the material to be deposited.

14. The deposition apparatus as claimed in claim 13, wherein the reactive gas is selected from the group consisting of oxygen, nitrogen and gases that form carbide, halide, sulfide and fluoride compounds.

15. The deposition apparatus as claimed in claim 11, wherein the material to be deposited comprises a metal.

16. The deposition apparatus as claimed in claim 13, wherein the material to be deposited is selected from the group consisting of carbon, silicon, and conductive metals.

17. The deposition apparatus as claimed in claim 11, wherein the gas injected into the chamber is chemically inert with the material to be deposited.

18. The deposition apparatus as claimed in claim 17, wherein the inert gas comprises a noble gas.

19. In an apparatus for depositing a thin film of material in a vacuum chamber, having means for holding a substrate disposed within said vacuum chamber; means for injecting a pulse of gas into said chamber; electrode means disposed between said gas injecting means and said substrate holder, said electrode means having a cathode and an anode, at least one of said cathode and said anode being constructed from the material to be deposited; means for causing an arc to be discharged between said cathode and anode; wherein the improvement comprises: means for controlling the gas pulse injecting means and said arc discharging means such that a gas pulse is first triggered with an arc being triggered after the gas pulse commences and said arc ending before said gas pulse terminates, such that material ablated from the electrodes will be carried by the pulse of gas towards the substrate and being deposited thereon.

20. The deposition apparatus as claimed in claim 19, wherein the duration of the gas pulse is on the order of at least 10 times that of the arc discharge.

* * * * *